US008631857B2

(12) United States Patent
Lin

(10) Patent No.: US 8,631,857 B2
(45) Date of Patent: Jan. 21, 2014

(54) FINNED AIR-GUIDING HEAT-DISSIPATING STRUCTURE AND HEAT-DISSIPATING MODULE HAVING THE SAME

(75) Inventor: Sheng-Huang Lin, Sinjhuang (TW)

(73) Assignee: Asia Vital Components Co., Ltd., Sinjhuang (TW)

( * ) Notice: Subject to any disclaimer, the term of this patent is extended or adjusted under 35 U.S.C. 154(b) by 428 days.

(21) Appl. No.: 12/825,361

(22) Filed: Jun. 29, 2010

(65) Prior Publication Data
US 2011/0315358 A1 Dec. 29, 2011

(51) Int. Cl.
*F28F 7/00* (2006.01)
*H05K 7/20* (2006.01)
(52) U.S. Cl.
USPC .......................................... 165/80.3; 361/704
(58) Field of Classification Search
USPC .............................. 165/80.3, 104.33; 361/704
See application file for complete search history.

(56) References Cited

U.S. PATENT DOCUMENTS

| 6,816,373 B2 * | 11/2004 | Lee et al. ....................... 361/697 |
| 2003/0141041 A1 * | 7/2003 | Chen ............................. 165/80.3 |
| 2007/0119567 A1 * | 5/2007 | Yeh et al. ....................... 165/80.3 |

\* cited by examiner

*Primary Examiner* — Brandon M Rosati
(74) *Attorney, Agent, or Firm* — C. G. Mersereau; Nikolai & Mersereau, P.A.

(57) ABSTRACT

A finned air-guiding heat-dissipating structure includes a heat sink having heat-dissipating fins arranged at intervals. At least one heat-dissipating channel is formed between the heat-dissipating fins. The heat-dissipating fins form an intake side and a first exhaust side and a second exhaust side in communication with the intake side through the heat-dissipating channels. The first exhaust side and the second exhaust side are located on both ends of the intake side and on both sides of the heat sink. A first exhaust trough and a second exhaust trough are provided on the other two sides of the heat sink and in communication with the intake side through the heat-dissipating channels. The heat sink is connected to a fan to form a heat-dissipating module. With this arrangement, the heat sink can guide airflow toward plural sides, so that the heat can be dissipated outside rapidly to achieve an excellent heat-dissipating effect.

12 Claims, 10 Drawing Sheets

FINNED AIR-GUIDING HEAT-DISSIPATING STRUCTURE AND HEAT-DISSIPATING MODULE HAVING THE SAME

BACKGROUND OF THE INVENTION

1. Field of the Invention

The present invention relates to a finned air-guiding heat-dissipating structure and a heat-dissipating module having the same, and in particular to a finned air-guiding heat-dissipating structure capable of guiding airflow toward plural sides and a heat-dissipating module having the same.

2. Description of Prior Art

With the advancement of semiconductor technology, integrated circuits have been manufactured with reduced volume. In order to make the integrated circuit to process greater amount of data, many times of operating elements are provided in the integrated circuit of the same volume than before. When such a huge number of operating elements are provided in the integrated circuit, more heat will be generated by these operating elements in their operation. For example, when a central processor is in high load duty, the heat generated by the central processor may burn down itself. Thus, it is an important issue to provide a heat-dissipating structure for the integrated circuits.

Please refer to FIG. 1, which is an assembled perspective view showing a conventional heat-dissipating module. The heat-dissipating module 1 is constituted of a fan 11 and a heat sink 12. The fan 11 is arranged on one side of the heat sink 12. The heat sink 12 has a plurality of heat-dissipating fins 121. A heat-dissipating channel 122 is formed between adjacent two of the heat-dissipating fins 121. The fan 11 has an exhaust side 111 facing the heat-dissipating channels 122.

Both ends of each heat-dissipating channel 122 between the heat-dissipating fins 121 are open. When the fan 11 generates a heat-dissipating airflow 2 for dissipating the heat of the heat sink 12, the heat-dissipating airflow 2 enters the heat-dissipating channels 122 from the exhaust side 111 and is exhausted to the outside of the heat-dissipating channels 122 through both open ends thereof, thereby generating a heat-dissipating effect. However, since the heat-dissipating airflow 2 generated by the fan 11 can be only exhausted from both sides, the heat-dissipating efficiency is so limited that the heat may be accumulated in the heat sink 12 easily. Furthermore, only one heat source can be thermally dissipated at a time, so that the heat-dissipating efficiency of the whole heat sink is insufficient.

According to the above, the conventional heat-dissipating module has drawbacks as follows: (1) low in heat-dissipating efficiency; (2) easy to accumulate heat therein; and (3) poor in heat-dissipating performance.

SUMMARY OF THE INVENTION

In order to solve the above problems, an objective of the present invention is to provide a finned air-guiding heat-dissipating structure capable of guiding airflow toward plural sides.

Another objective of the present invention is to provide heat-dissipating module having a finned air-guiding heat-dissipating structure capable of guiding airflow toward plural sides.

In order to achieve the above objectives, the present invention provides a finned air-guiding heat-dissipating structure, comprising a heat sink having a plurality of heat-dissipating fins arranged at intervals, at least one heat-dissipating channel being formed between the adjacent heat-dissipating fins, the heat-dissipating fins forming an intake side and a first exhaust side and a second exhaust side in communication with the intake side through the heat-dissipating channels, the first exhaust side and the second exhaust side being located on both ends of the intake side and on both sides of the heat sink, a first exhaust trough and a second exhaust trough being provided on the other two sides of the heat sink and in communication with the intake side through the heat-dissipating channels.

In order to achieve the above objectives, the present invention provides a heat-dissipating module having a finned air-guiding heat-dissipating structure capable of guiding airflow toward plural sides. The heat-dissipating module comprises a heat sink of the aforesaid finned air-guiding heat-dissipating structure capable of guiding airflow toward plural sides and a fan connected to the heat sink. With a first exhaust trough and a second exhaust trough of the heat sink, the heat sink can guide airflow toward plural sides, so that the heat sink can dissipate the heat rapidly with an excellent heat-dissipating effect. Therefore, the present invention has advantageous features as follows: (1) high in heat-dissipating efficiency; (2) superior in heat-dissipating performance; and (3) fast to dissipate the heat without accumulating therein.

DETAILED DESCRIPTION OF THE INVENTION

The above-mentioned objectives, structural and functional features of the present invention will be described with reference to preferred embodiments thereof and the accompanying drawings.

Figure 1:
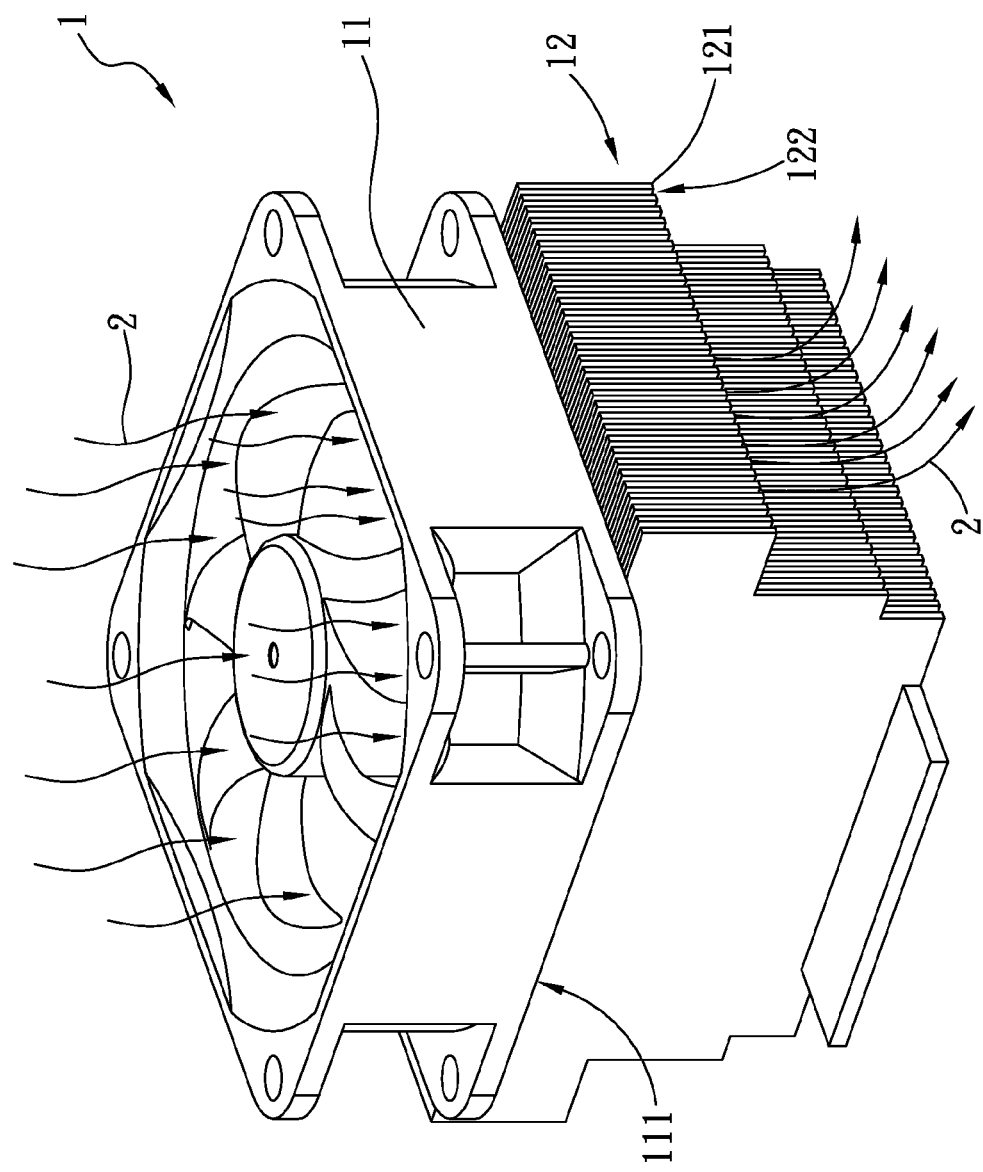
FIG. 1 is a perspective view showing a conventional heat-dissipating module.
Figure 2A:
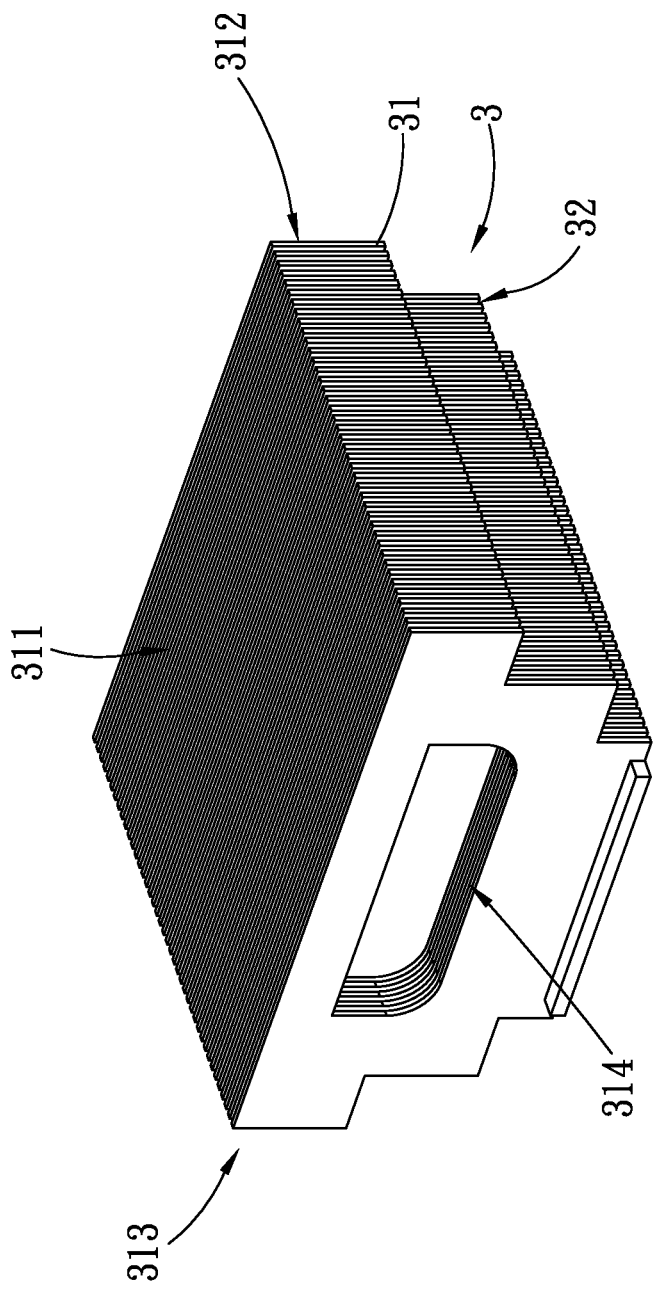
FIG. 2a is a perspective view showing a heat sink according to a first embodiment of the present invention.
Figure 2B:
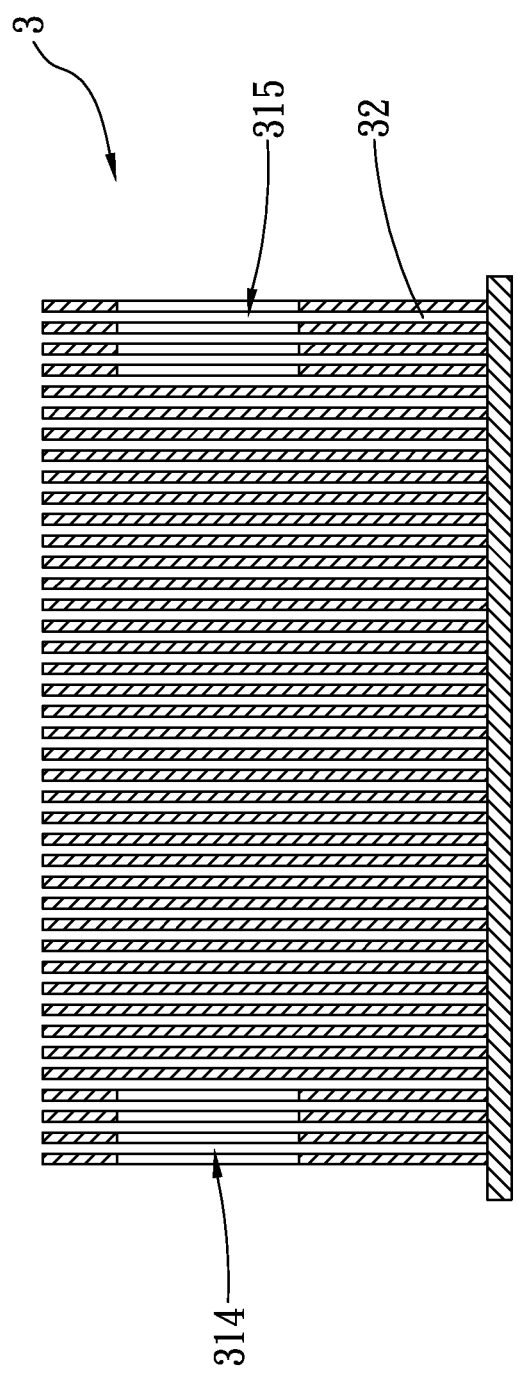
FIG. 2b is a cross-sectional view showing a heat sink according to the first embodiment of the present invention.

Please refer to FIGS. 2a and 2b, which are a perspective view and a cross-sectional view showing a heat sink according to the first embodiment of the present invention. The finned air-guiding heat-dissipating structure comprises a heat sink 3. The heat sink 3 has a plurality of heat-dissipating fins 31 arranged at intervals. At least one heat-dissipating channel 32 is formed between adjacent two of the heat-dissipating fins 31. The heat-dissipating fins 31 form an intake side 311 and a first exhaust side 312 and a second exhaust side 313 in communication with the intake side 311 through the heat-dissipating channels 32. The first exhaust side 312 and the second exhaust side 313 are located on both ends of the intake side 311 and on both sides of the heat sink 3. Further, a first exhaust trough 314 and a second exhaust groove 315 are provided on the other two sides of the heat sink 3 and in communication with the intake side 311 through the heat-dissipating channels 32. The heat sink 3 is formed by stacking a plurality of heat-dissipating fins 31.

Figure 3:
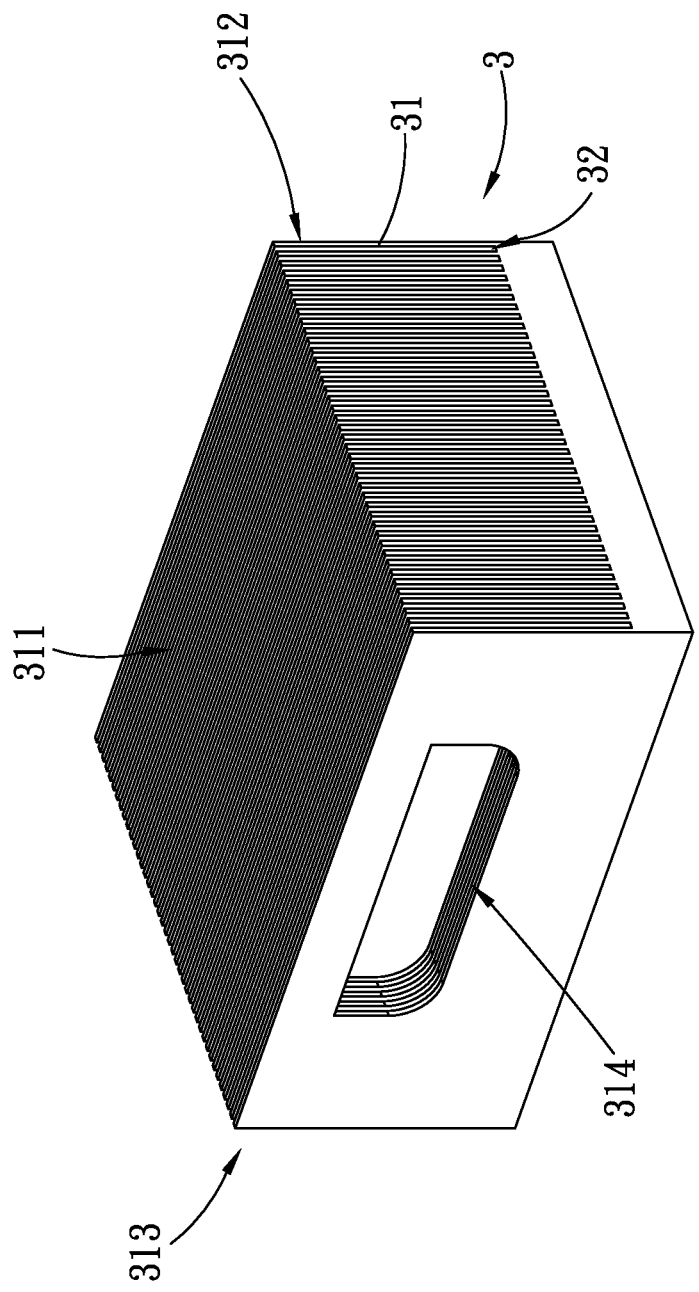
FIG. 3 is a perspective view showing a heat sink according to a second embodiment of the present invention.

Please refer to FIG. 3, which is a perspective view showing the heat sink according to the second embodiment of the present invention. The structure of the present embodiment is substantially the same as that of the first embodiment. The description relating to the parts of the second embodiment corresponding to the first embodiment will be omitted for simplicity. The difference between the second embodiment and the first embodiment lies in that the present embodiment utilizes a block-shaped heat sink 3.

Figure 4:
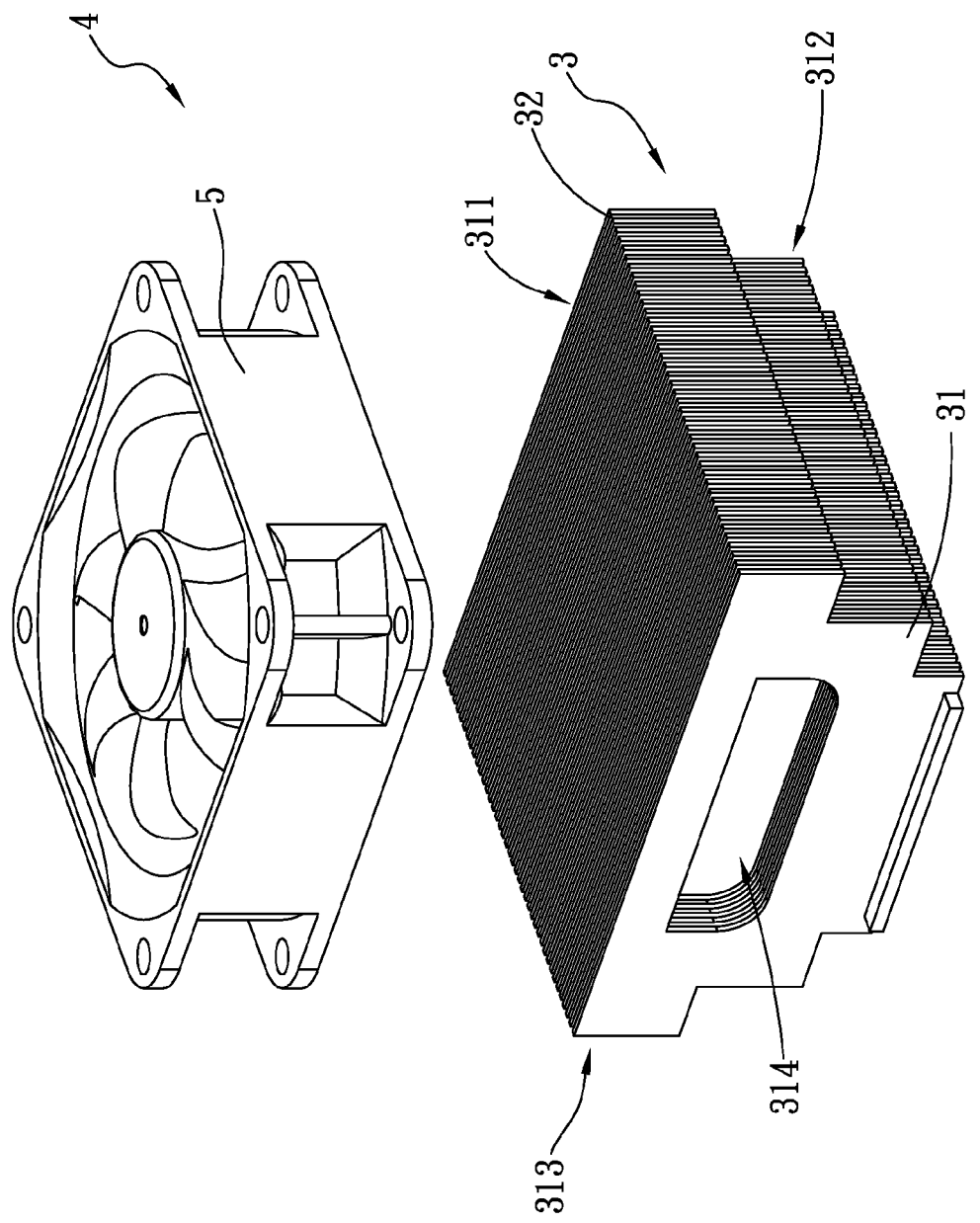
FIG. 4 is an exploded perspective view showing a heat-dissipating module according to a first embodiment of the present invention.
Figure 5:
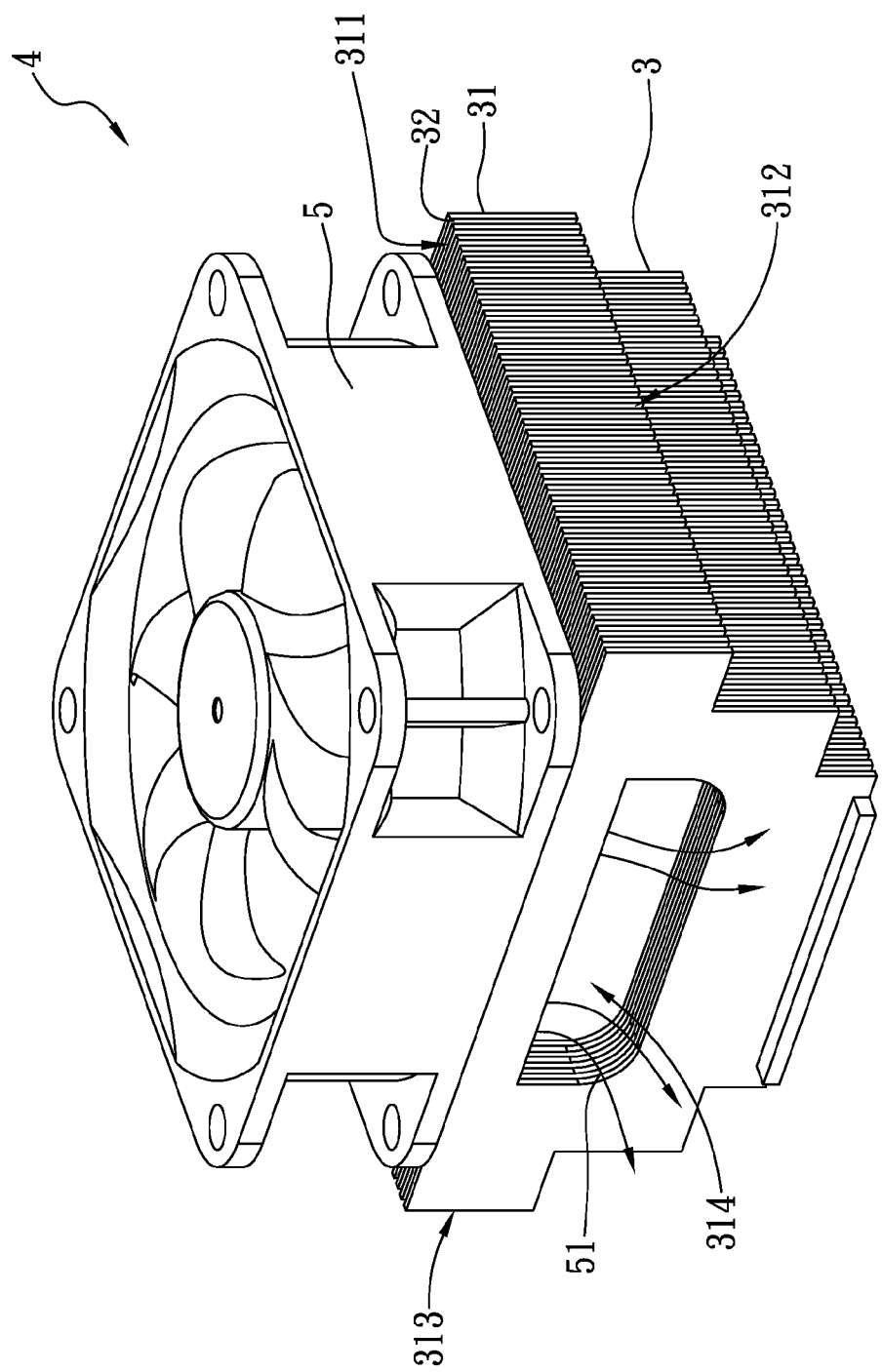
FIG. 5 is an assembled perspective view showing a heat-dissipating module according to the first embodiment of the present invention.
Figure 6:
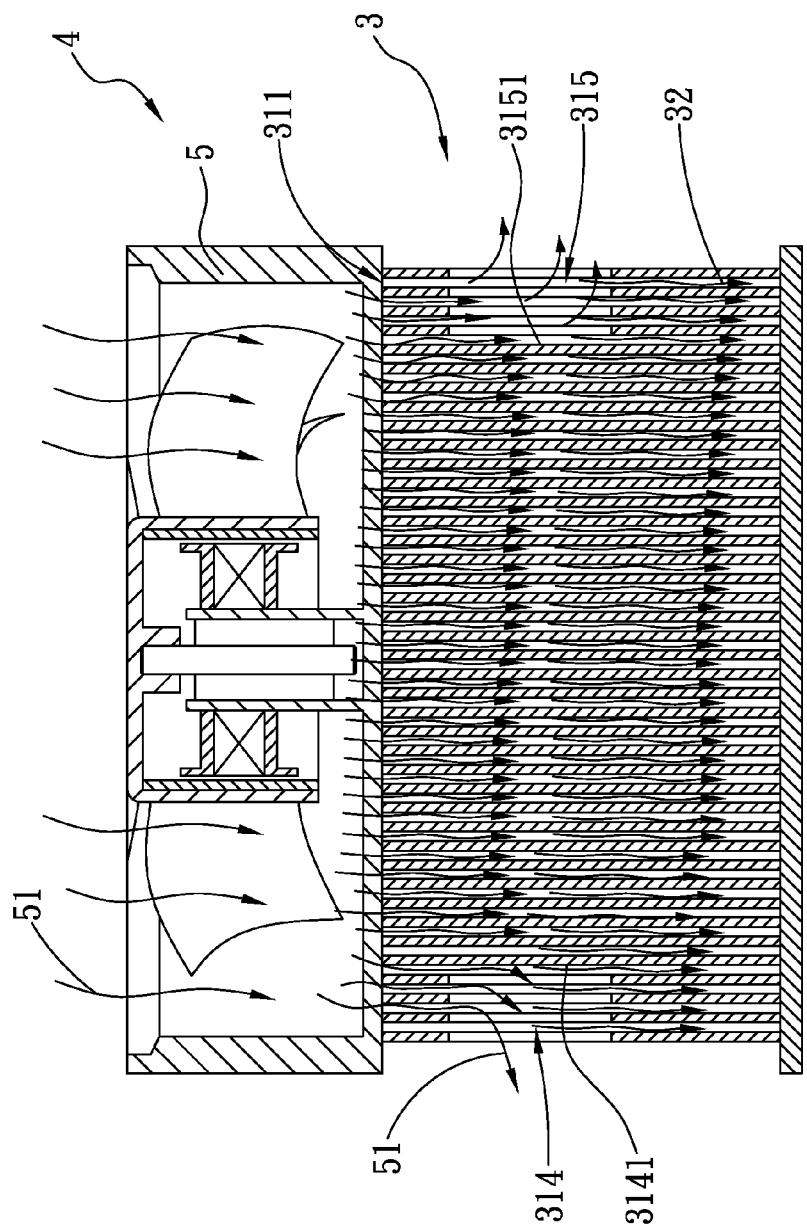
FIG. 6 is an assembled cross-sectional view showing a heat-dissipating module according to the first embodiment of the present invention.

Please refer to FIGS. 4 to 6, which are an exploded perspective view, an assembled view, and an assembled cross-sectional view showing the heat-dissipating module according to the first embodiment of the present invention. As shown in these figures, the heat-dissipating module 4 comprises a heat sink 3 and a fan 5. The heat sink 3 has a plurality of heat-dissipating fins 31 arranged at intervals. At least one heat-dissipating channel 32 is formed between adjacent two of the heat-dissipating fins 31. The heat-dissipating fins 31 form an intake side 311 and a first exhaust side 312 and a second exhaust side 313 in communication with the intake side 311 through the heat-dissipating channels 32. The first exhaust side 312 and the second exhaust side 313 are located on both ends of the intake side 311 and on both sides of the heat sink 3. Further, a first exhaust trough 314 and a second exhaust groove 315 are provided on the other two sides of the heat sink 3 and in communication with the intake side 311 through the heat-dissipating channels 32. The heat sink 3 is formed by stacking a plurality of heat-dissipating fins 31. The fan 5 is assembled on one side of the heat sink 3 to face the intake side 311.

The first exhaust trough 314 extends toward the second exhaust trough 315 and has a first side 3141 communicated with the heat-dissipating channels 32. The second exhaust trough 315 extends toward the first exhaust trough 314 and has a second side 3151 communicated with the heat-dissipating channels 32.

When the fan 5 generates a heat-dissipating airflow 51, the heat-dissipating airflow 51 is guided by the fan 5 to enter the heat-dissipating channels 32 through the intake side 311. Then, the heat-dissipating airflow 51 flows through the heat-dissipating channels 32 toward the first exhaust side 312 and the second exhaust side 313. Finally, the heat-dissipating airflow 51 is exhausted to the outside of the heart sink 3 through the first exhaust trough 314 and the second exhaust trough 315. In this way, the heat can be rapidly dissipated to the outside of the heat sink 3 without being accumulated in the heat sink 3.

Figure 7:
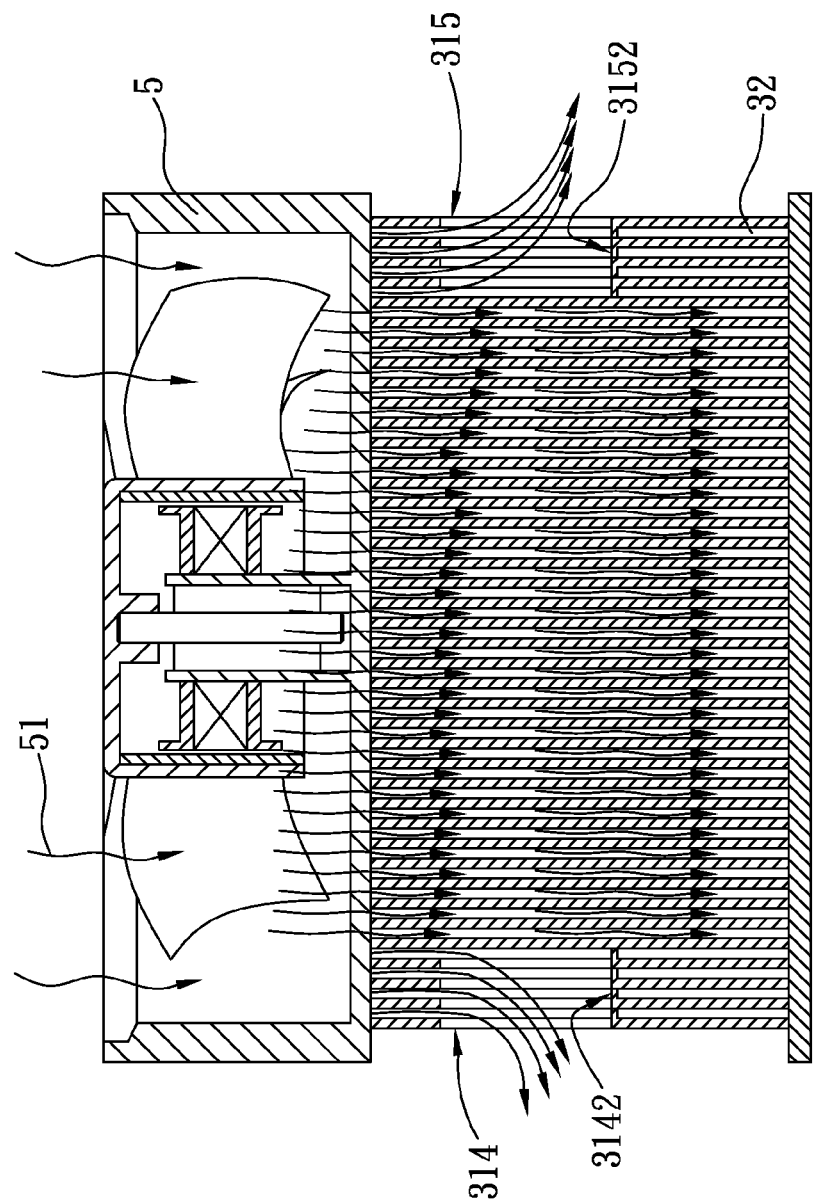
FIG. 7 is an assembled cross-sectional view showing a heat-dissipating module according to a second embodiment of the present invention.
Figure 8:
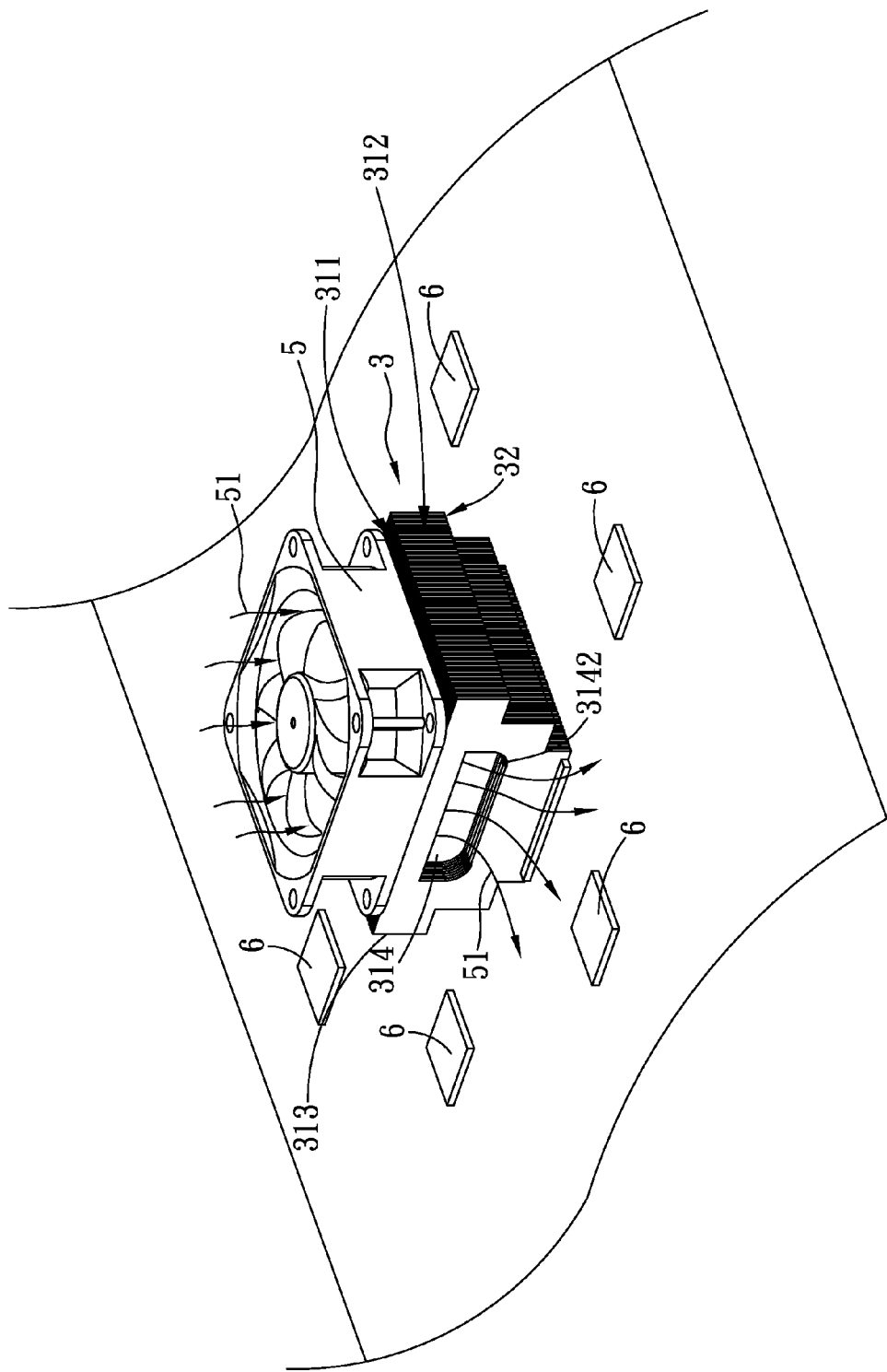
FIG. 8 is a schematic view showing the operating state of the heat-dissipating module according to the second embodiment of the present invention.

Please refer to FIGS. 7 and 8, which are an assembled cross-section view showing the heat-dissipating module according to the second embodiment of the present invention and a schematic view showing the operating state thereof. The structure and arrangement of the second embodiment is substantially the same as those of the first embodiment. The description relating to the parts of the second embodiment corresponding to the first embodiment will be omitted for simplicity. The differences between the second embodiment and the first embodiment are as follows. In the second embodiment, the first exhaust trough 314 has a first closed side 3142. The second exhaust trough 315 has a second closed side 3152. The first closed side 3142 and the second closed side 3152 are not in communication with the heat-dissipating channels 32.

Figure 9:
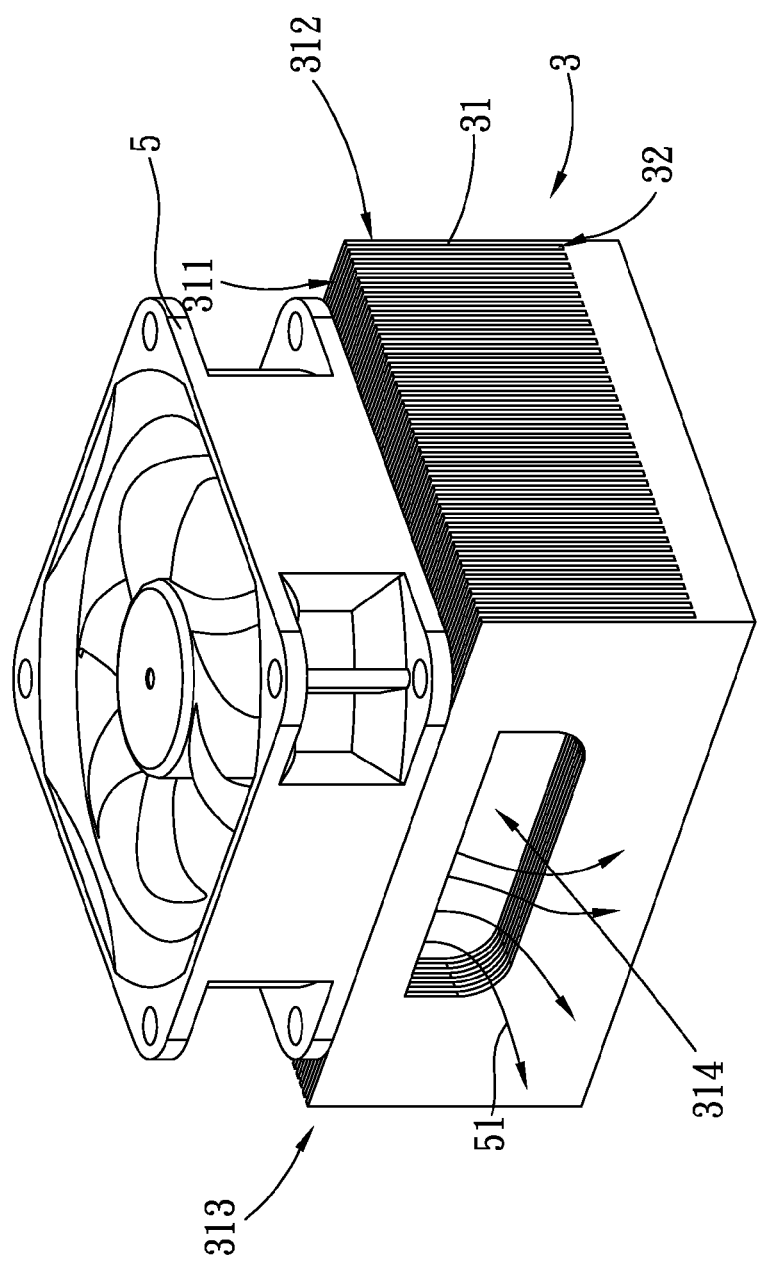
FIG. 9 is an assembled perspective view showing a heat-dissipating module according to a third embodiment of the present invention.

Please refer to FIG. 9, which is a perspective view showing the heat-dissipating module according to the third embodiment of the present invention. The structure and arrangement of the third embodiment are substantially the same as those of the first and the second embodiments. The description relating to the parts of the third embodiment corresponding to the previous embodiments will be omitted for simplicity. The difference between the third embodiment and the previous embodiments lies in that the present embodiment utilizes a block-shaped heat sink 3.

Please refer to FIGS. 7 to 9. When the fan 5 generates a heat-dissipating airflow 51, the heat-dissipating airflow 51 is guided by the fan 5 to enter the heat-dissipating channels 32 through the intake side 311. Then, the heat-dissipating airflow 51 flows through the heat-dissipating channels 32 toward the first exhaust side 312 and the second exhaust side 313. Finally, the heat-dissipating airflow 51 is exhausted to the outside of the heart sink 3 through the first exhaust trough 314 and the second exhaust trough 315. In the present embodiment, since the first closed side 3142 and the second closed side 3152 are not in communication with the heat-dissipating channels 32, the heat-dissipating airflow 51 is blocked by the first closed side 3142 and the second closed side 3152 and directly exhausted to the outside of the first exhaust trough 314 and the second exhaust trough 315. In this way, not only the heat can be rapidly dissipated to the outside of the heat sink 3 without being accumulated therein, but also other heat-generating elements 6 adjacent to the heat sink 3 can be cooled.

Although the present invention has been described with reference to the foregoing preferred embodiments, it will be understood that the invention is not limited to the details thereof. Various equivalent variations and modifications can still occur to those skilled in this art in view of the teachings of the present invention. Thus, all such variations and equivalent modifications are also embraced within the scope of the invention as defined in the appended claims.

What is claimed is:

1. A finned air-guiding heat-dissipating structure, comprising a heat sink having a plurality of heat-dissipating fins arranged at intervals, at least one heat-dissipating channel being formed between the adjacent heat-dissipating fins, the heat-dissipating fins forming an intake side and a first exhaust side and a second exhaust side in communication with the intake side through the heat-dissipating channels, the first exhaust side and the second exhaust side being located on both ends of the intake side and on a first side and a second side of the heat sink, the first side and the second side being opposite one another, a first exhaust trough, and a second exhaust trough spaced from and separated from said first exhaust trough, being provided on a third side and a fourth side, respectively, of the heat sink, the third side and the fourth side being opposite one another, said first and second exhaust troughs comprising wide openings, intermediate a top and a bottom of the heat-dissipating fin, and involving a minor number of the plurality of heat-dissipating fins, are open to the outside and in communication with the intake side through the heat-dissipating channels, whereby heat-dissipating airflow is also exhausted directly to the outside of the heat sink through said first and second exhaust troughs, and the first and second exhaust troughs are perpendicular to the intake side, the heat-dissipating channels, and the first and second exhaust sides, enabling heat-dissipating airflow to exhaust from the first, second, third, and fourth sides of the heat sink.

2. The finned air-guiding heat-dissipating structure according to claim 1, wherein the first exhaust trough extends toward the second exhaust trough and has a first side communicated with the heat-dissipating channels.

3. The finned air-guiding heat-dissipating structure according to claim 1, wherein the second exhaust trough extends toward the first exhaust trough and has a second side communicated with the heat-dissipating channels.

4. The finned air-guiding heat-dissipating structure according to claim 1, wherein the first exhaust trough further has a first closed side, the second exhaust trough further has a second closed side, both the first closed side and the second closed side are not in communication with the heat-dissipating channels.

5. The finned air-guiding heat-dissipating structure according to claim 1, wherein the heat sink is formed by stacking a plurality of heat-dissipating fins.

6. The finned air-guiding heat-dissipating structure according to claim 1, wherein the heat sink is a block-like heat sink.

7. A heat-dissipating module, comprising:
a heat sink having a plurality of heat-dissipating fins arranged at intervals, at least one heat-dissipating channel being formed between the adjacent heat-dissipating fins, the heat-dissipating fins forming an intake side and a first exhaust side and a second exhaust side in communication with the intake side through the heat-dissipating channels, the first exhaust side and the second exhaust side being located on both ends of the intake side and on a first side and a second side of the heat sink, the first side and the second side being opposite one another, a first exhaust trough, and a second exhaust trough spaced from and separated from said first exhaust trough, being provided on a third side and a fourth side, respectively, of the heat sink, the third side and the fourth side being opposite one another, said first and second exhaust troughs comprising wide openings, intermediate a top and a bottom of the heat-dissipating fin, and involving a minor number of the plurality of heat-dissipating fins, are open to the outside and in communication with the intake side through the heat-dissipating channels, whereby heat-dissipating airflow is also exhausted directly to the outside of the heat sink through said first and second exhaust troughs, and the first and second exhaust troughs are perpendicular to the intake side, the heat-dissipating channels, and the first and second exhaust sides, enabling heat-dissipating airflow to exhaust from the first, second, third, and fourth sides of the heat sink; and
a fan connected to one side of the heat sink to face the intake side wherein heat-dissipating airflow is exhausted directly to the outside of the heat sink through said first and second exhaust troughs.

8. The heat-dissipating module according to claim 7, wherein the first exhaust trough extends toward the second exhaust trough and has a first side communicated with the heat-dissipating channels.

9. The heat-dissipating module according to claim 7, wherein the second exhaust trough extends toward the first exhaust trough and has a second side communicated with the heat-dissipating channels.

10. The heat-dissipating module according to claim 7, wherein the first exhaust trough further has a first closed side, the second exhaust trough further has a second closed side, both the first closed side and the second closed side are not in communication with the heat-dissipating channels.

11. The heat-dissipating module according to claim 7, wherein the heat sink is formed by stacking a plurality of heat-dissipating fins.

12. The heat-dissipating module according to claim 7, wherein the heat sink is a block-like heat sink.

* * * * *